(12) United States Patent
Sweet

(10) Patent No.: US 6,956,414 B2
(45) Date of Patent: Oct. 18, 2005

(54) SYSTEM AND METHOD FOR CREATING A LIMITED DURATION CLOCK DIVIDER RESET

(75) Inventor: Jim Sweet, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/797,533

(22) Filed: Mar. 10, 2004

(65) Prior Publication Data

US 2005/0179476 A1 Aug. 18, 2005

Related U.S. Application Data

(60) Provisional application No. 60/545,884, filed on Feb. 17, 2004.

(51) Int. Cl.[7] ............................. H03L 7/00; H03K 3/02
(52) U.S. Cl. ..................................... 327/142; 327/198
(58) Field of Search ................................. 327/142, 143, 327/198, 160, 162, 155

(56) References Cited

U.S. PATENT DOCUMENTS 5,323,066 A * 6/1994 Feddeler et al. ............ 327/142
5,708,381 A * 1/1998 Higashisaka ................ 327/276
6,473,476 B1 * 10/2002 Banks ......................... 375/354
6,611,158 B2 * 8/2003 Ehmann ...................... 327/142
2004/0267848 A1 * 12/2004 Govindarajan .............. 708/270

FOREIGN PATENT DOCUMENTS

JP          8-29496      *  2/1996

* cited by examiner

Primary Examiner—Tuan T. Lam
(74) Attorney, Agent, or Firm—McAndrews, Held & Malloy, Ltd.

(57) ABSTRACT

Systems and methods for creating a limited duration clock divider reset are disclosed. Aspects of the invention may include a method for resetting a chip or a circuit. The method may include buffering a main reset input signal, inverting the main reset input signal to create an active high reset signal, resetting a counter utilizing the active high reset signal, comparing a counter output value and a counter-associated value in a comparator to obtain a comparator output value, and applying an OR logical operation to the comparator output. A limited duration clock divider reset may be generated from the output of the OR logical operation. The OR logical operation may be applied to the buffered main reset input signal. The comparator output may be inverted.

29 Claims, 3 Drawing Sheets

SYSTEM AND METHOD FOR CREATING A LIMITED DURATION CLOCK DIVIDER RESET

CROSS-REFERENCE TO RELATED APPLICATIONS/INCORPORATION BY REFERENCE

This application makes reference to, claims priority to, and claims the benefit of U.S. Provisional Application Ser. No. 60/545,884, filed Feb. 17, 2004 and entitled "System and Method for Creating a Limited Duration Clock Divider Reset."

The above stated application is incorporated herein by reference in its entirety.

FIELD OF THE INVENTION

Certain embodiments of the invention relate to electrical circuits. More specifically, certain embodiments of the invention relate to a system and method for creating a limited duration clock divider reset.

BACKGROUND OF THE INVENTION

Reset signals may be used to force flip-flops inside a chip to a known state. In instances where flip-flops are used to make clock-divider circuits, resetting these flip-flops may be problematic because the clocks that are normally outputs of the clock divider circuit may not run during reset. The reason may be that the flip-flops are held in a certain state the entire time that the reset signal is asserted. Without the clock running, some portions of the chip may not get properly initialized. For example, a pipeline design may rely on the clock to be running in order for cleared data to get clocked all the way through the pipeline.

In conventional chips, there may be three common scenarios with regard to clock dividers. There may be clock divider flip-flops that do not use any sort of reset signal to get them into a known state. In silicon, the flip-flops may start in a particular state, either 0 or 1. The clock output from the divider may then run. However, since the flip-flops can come up in either state, the phase of the resulting clock is not predictable. In certain situations, for example in functional test vectors, it is problematic to have the phase of the clock not be repeatable because the resulting overall behavior of the chip will not be repeatable. This may cause vectors to mismatch because the shifted clock phase results in actual chip behavior being time-shifted from the expected behavior.

The clock divider flip-flops may also use the same main reset signal as a chip reset signal. In this scenario, the clocks generated by the clock divider do not run during reset and this may be problematic for a variety of reasons. For example, a pipeline design may be configured so that it is not reset directly, but gets reset or cleared when known data from flip-flops, for example, gets clocked through the pipeline during reset. As a result, at the end of a reset, the output of the pipeline is in a known state, so any circuitry which uses this data will have valid data immediately after reset is de-asserted. However, if the clock is not running, then the known data may not get clocked through the pipeline, and any circuitry which uses the output of the pipeline may receive invalid data immediately after reset is de-asserted. The clock may not run because the clock divider flip-flops are being held in reset the entire time the chip's reset is asserted.

In addition, the clock divider reset may be generated via a pin of the chip, and the reset utilized by the rest of the chip may be a delayed version of the main reset input. In this scenario the clocks may not be allowed to run while the chip's main internal reset is still asserted. However, it means that the main portion of the chip may come out of reset significantly after the reset input to the chip is de-asserted. This may cause timing problems if the chip is coupled to other devices. For example, if the chip has a PCI interface, then an external PCI master on the board may start a transaction immediately after the board reset is de-asserted. However, since the main internal reset in the chip is delayed, the chip's PCI interface will still be dead or invalid because it is being held in reset and it may miss this initial transaction.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a system and method for creating a limited duration clock divider reset. Aspects of the invention may include a clock divider circuit. The clock divider circuit may comprise a first inverter coupled to a counter, a first buffer coupled to the first inverter, a comparator coupled to an output of the counter, an OR gate coupled to an output of the comparator, a second buffer coupled to the OR gate and the first buffer, and a feedback path coupling the output of the comparator to the counter. The first inverter may be coupled to a reset input of the counter. A clock input of the counter may be coupled to an external pin clock signal. A clock input of the counter may be coupled to a PLL. A first input of the comparator may be coupled to a count output of the counter. A second input of the comparator may be coupled to a signal having a full count value. The output of the second buffer may be a reset signal. The output of the OR gate may be a clock divider reset signal. The feedback path may comprise a second inverter coupled to an output of the comparator and an input of the counter. The second inverter may be coupled to a count enable input of the counter. An output of the first buffer may be coupled to an input of the OR gate. The first buffer may be coupled to an external reset signal.

Another aspect of the invention may provide a method for resetting a chip or a circuit. The method may include generating a limited duration clock divider reset, where the limited duration clock divider reset may be independent from a reset signal used to reset the chip or the circuit, and resetting the chip or the circuit using the generated limited duration clock divider reset.

In yet a different aspect of the invention, a method for resetting a chip or a circuit may include buffering a main reset input signal, inverting the main reset input signal to create an active high reset signal, resetting a counter utilizing the active high reset signal, comparing a counter output value and a counter-associated value in a comparator to obtain a comparator output value, and applying a logical OR operator to the comparator output. A limited duration clock divider reset may be generated from the output of the logical OR operator. The logical OR operator may be applied to the buffered main reset input signal and an output of the comparator. The comparator output may be inverted. The counter may be enabled via the inverted comparator output. A clock input of the counter may be adapted to receive a clock signal via an external pin. A clock input of the counter may be coupled to a PLL. A full count value signal may be received by an input of the comparator and an output of the full count value may be based on a maximum count value of the counter.

These and other advantages, aspects and novel features of the present invention, as well as details of an illustrated embodiment thereof, will be more fully understood from the following description and drawings.

DETAILED DESCRIPTION OF THE INVENTION

Certain embodiments of the present invention may be found in a system and method for creating a limited duration clock divider reset. A clock divider circuit in accordance with an embodiment of the present invention may comprise a first inverter coupled to a counter, a first buffer coupled to the first inverter, a comparator coupled to an output of the counter, an OR gate coupled to an output of the comparator, a second buffer coupled to the OR gate and the first buffer, and a feedback path coupling the output of the comparator to the counter. A short reset pulse may be generated whenever a main reset is asserted. The short reset signal, called a "clock divider reset", for example, may be asserted briefly at the beginning of the long main reset pulse. It may then get de-asserted while the main reset pulse is still asserted. This may allow the clock outputs of the clock divider circuit to run while the main reset is still asserted. The counter may normally be held in a reset state when the chip's main reset is not asserted, and the counter may be removed from the reset state when the chip's main reset is asserted.

Figure 1:
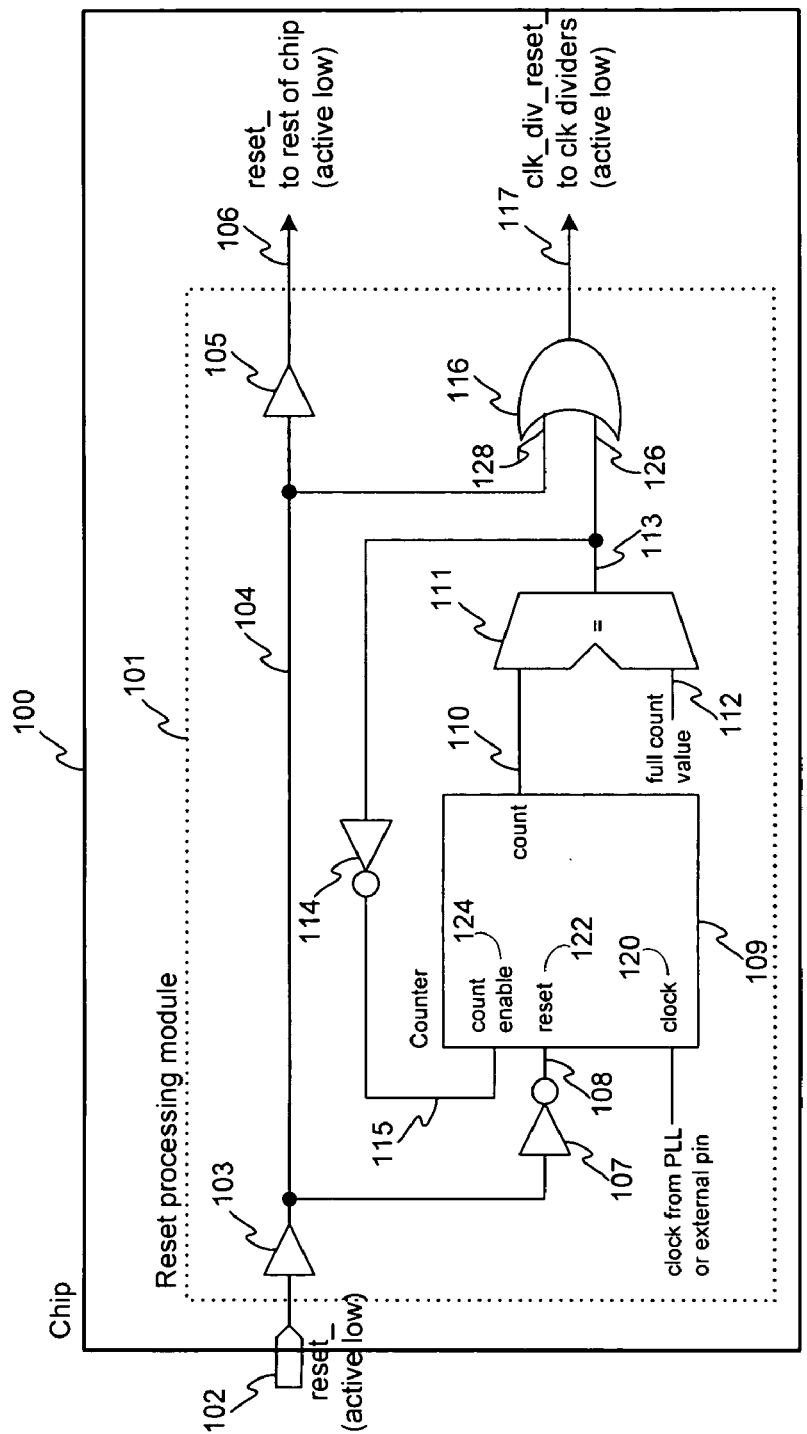
FIG. 1 is a block diagram of a chip comprising a limited duration clock divider reset circuit utilizing an active low reset input, in accordance with an embodiment of the present invention.

FIG. 1 is a block diagram of a chip 100 comprising a limited duration clock divider reset circuit, in accordance with an embodiment of the present invention. Referring to FIG. 1, the chip 100 may comprise a reset processing module 101. The reset processing module 101 may comprise a first buffer 103, a second buffer 105, a first inverter 107, a second inverter 114, a counter 109, a comparator 111, and an OR gate 116. The counter 109 may comprise a count enable input 124, a reset input 122, a clock input 120, and a count output 110. Although only the reset processing module 101 is shown in FIG. 1, other modules (not shown) may be integrated within chip 100.

An external reset pad 102 on chip 100 may be coupled to an input of the first buffer 103. An output 104 of the first buffer 103 may be coupled to an input of the second buffer 105, an input of the first inverter 107, and an input 128 of the OR gate 116. An output of the first inverter 107 may be coupled to the reset input 122 of the counter 109. The clock input 120 of the counter 109 may be coupled to a clock signal. The count output 110 of the counter 109 may be coupled to an input of the comparator 111. A second input of the comparator 111 may be coupled to a full count value signal 112. An output 113 of the comparator 111 may be coupled to an input of the second inverter 114 and an input 126 of the OR gate 116. An output 115 of the second inverter 114 may be coupled to the count enable input of the counter 109. An output 106 of the second buffer 105 may comprise a reset signal, and an output 117 of the OR gate 116 may comprise a clock divider signal.

The main reset input signal asserted on the external reset pad 102 may be a signal communicated from a PCB (not shown) to which the chip 100 may be connected. The clock input 120 of the counter 109 may be coupled to an external phase lock loop (PLL) via a pin on chip 100. The reset input signal may be an active low reset signal (i.e. asserted when low), for example, and it may be coupled to an input pin of the chip 100. More specifically, the reset input signal 102 may be an input to the reset processing module 101. The reset input 102 may be coupled to the first buffer 103 and an output of the first buffer 103 may be a buffered version of the signal 104. The buffered reset signal 104 may go through another buffer 105 to create the chip's main internal reset signal 106. The main internal reset signal 106 for the chip 100 may be utilized to reset the functions in the chip 100.

In operation, after a reset signal is asserted on the external reset pad 102 and buffered by the first buffer 103, the output 104 of the first buffer 103 may be communicated to the first inverter 107. The first inverter 107 may create an active high reset signal 108 at its output. The active high reset signal 108 may be tied to the reset input 122 of the counter 109. When the main chip reset signal is not asserted, the counter 109 may be held in a reset state (normally a count value of 0, for example). However, when the chip's main reset signal is asserted, the counter 109 may initiate counting. The count value 110 may be communicated to a comparator 111. A full count value 112 may be utilized as an additional input to the comparator 111 to obtain the comparator output 113. The full count value 112 may comprise the maximum value that the counter 109 may count to before rolling over back to logic zero (0). For example, if the counter 109 is a 3-bit counter, its full count value would be seven (000–111 binary). Since the count value 110 is not yet at a maximum value, the comparator output 113 may be logic zero (0). The comparator output 113 may be communicated back to the second inverter 114, where the output 115 of the second inverter 114 may be logic one (1). The second inverter output 115 may be tied to the count enable input 124 of the counter 109, so that the counter may continue to count up. As the counter 109 is incrementing, the comparator output 113 may be low, so the corresponding input 126 to the OR gate 116 may be logic zero (0).

The second input 128 to the OR gate 116 may comprise the main reset signal 104, which may be logic zero (0), indicating that it may be asserted. Since both inputs 126 and 128 of the OR gate 116 are logic zero (0), the output 117 of the OR gate 116 may also be logic zero (0). The OR gate output 117 may be utilized as the clock divider reset, and it may be communicated to all the clock divider flip-flops on chip 100. The clock divider reset 117 may remain asserted as the count value 110 continues to increment. When the count value 110 reaches the full count value 112, the output 113 of the comparator 111 may become logic one (1). The count enable signal 115 may then be transformed to logic zero (0) and the counter 109 may cease counting. In this way, once the count value 110 equals the full count value 112, the count value 110 may stay at the full count value and not roll over to logic zero (0). Since the comparator output 113 is now logic one (1), the clock divider reset 117 also goes to logic one (1), which is its de-asserted state. Even though the main chip reset 106 is still asserted, the clock divider reset may become de-asserted. In this way, the clock divider reset 117 may be de-asserted while the main chip reset 106 may still be asserted. In one aspect of the invention, a width of the clock divider reset pulse may be increased or decreased by changing the number of bits in the counter 109.

Figure 2:
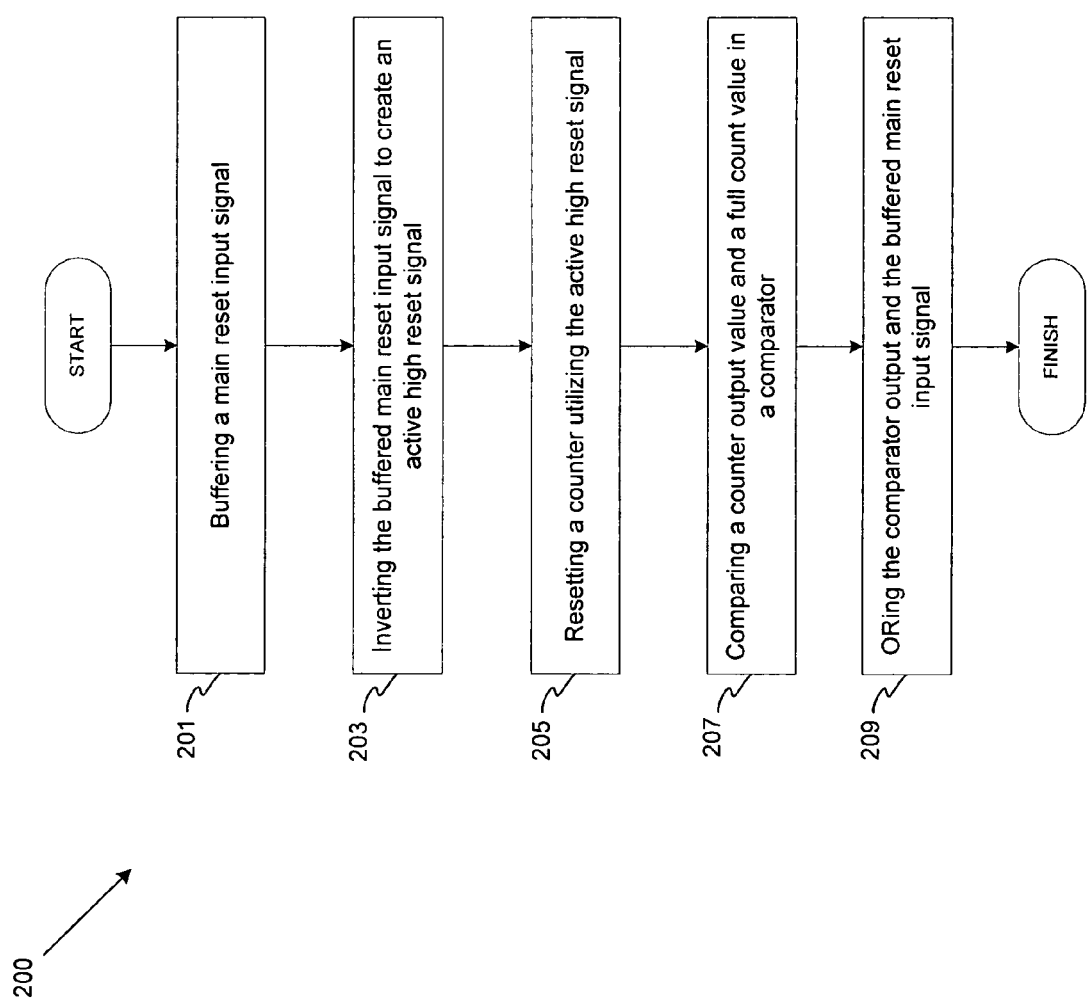
FIG. 2 is a flow diagram of a method for resetting a chip or a circuit, in accordance with an embodiment of the present invention.

FIG. 2 is a flow diagram of a method 200 for resetting a chip or a circuit, in accordance with an embodiment of the present invention. Referring to FIG. 2, at 201, a main reset input signal may be buffered by a buffer in a reset processing module. At 203, the buffered main reset input signal may be inverted to create an active high reset signal. At 205, a counter on the reset processing module may be reset utilizing the active high reset signal. At 207, a counter output value and a full count value may be compared by a comparator. At 209, the comparator output and the buffered main reset input signal may be ORed (i.e., passed through an OR gate).

Figure 3:
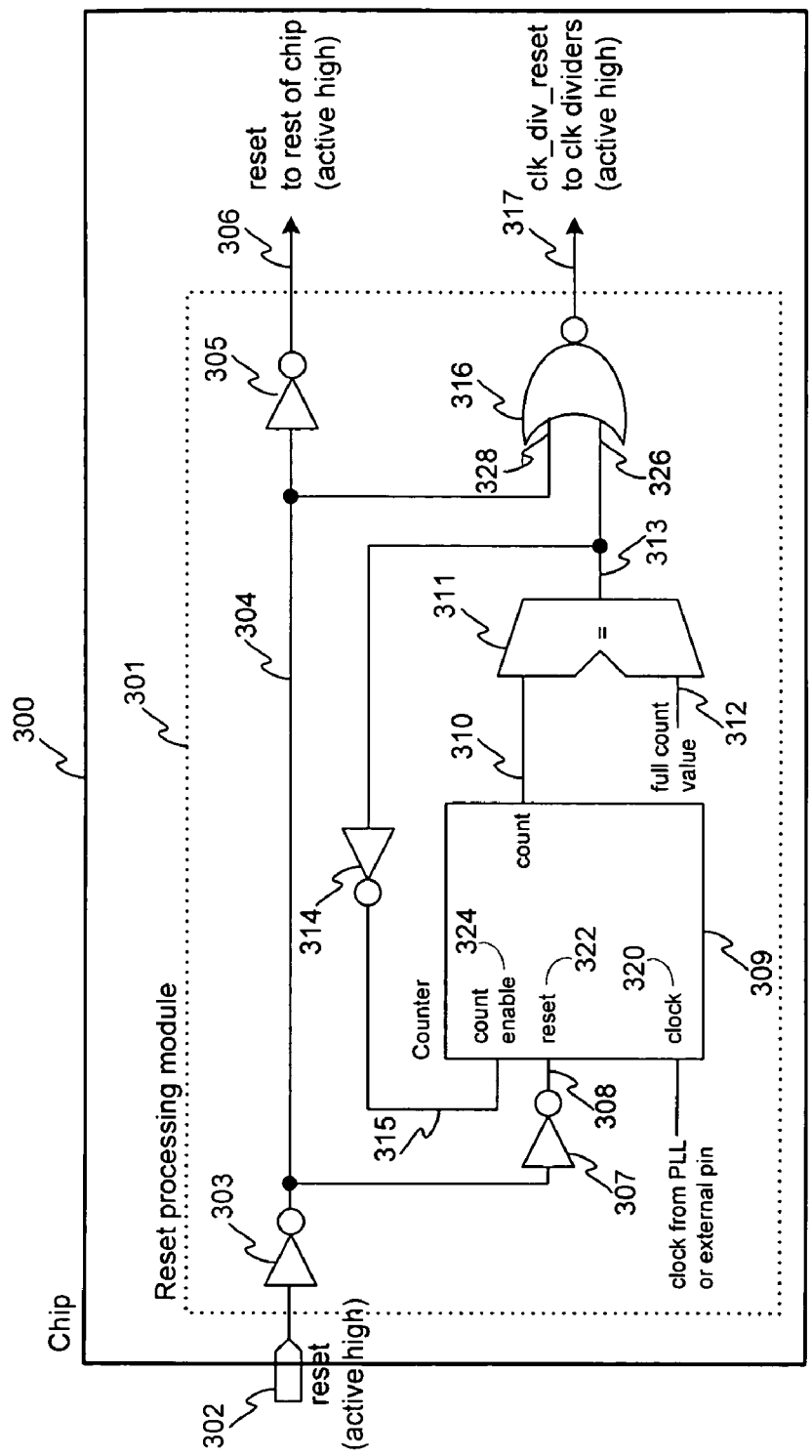
FIG. 3 is a block diagram of a chip comprising a limited duration clock divider reset circuit utilizing an active high reset input, in accordance with an embodiment of the present invention.

FIG. 3 is a block diagram of a chip 300 comprising a limited duration clock divider reset circuit utilizing an active high reset input, in accordance with an embodiment of the present invention. Referring to FIG. 3, the chip 300 may comprise a reset processing module 301. The reset processing module 301 may comprise a first inverter 303, a second inverter 305, a third inverter 307, a fourth inverter 314, a counter 309, a comparator 311, and a NOR gate 316. The counter 309 may comprise a count enable input 324, a reset input 322, a clock input 320, and a count output 310. Although only the reset processing module 301 is shown in FIG. 3, other modules (not shown) may be integrated within chip 300.

An external reset pad 302 on chip 300 may be coupled to an input of the first inverter 303. An output 304 of the first inverter 303 may be coupled to an input of the second inverter 305, an input of the third inverter 307, and an input 328 of the NOR gate 316. An output 308 of the third inverter 307 may be coupled to the reset input 322 of the counter 309. The clock input 320 of the counter 309 may be coupled to a clock signal. The count output 310 of the counter 309 may be coupled to an input of the comparator 311. A second input of the comparator 311 may be coupled to a full count value signal 312. An output 313 of the comparator 311 may be coupled to an input of the fourth inverter 314 and an input 326 of the NOR gate 316. An output 315 of the fourth inverter 314 may be coupled to the count enable input 324 of the counter 309. An output 306 of the second inverter 305 may comprise a reset signal, and an output 317 of the NOR gate 316 may comprise a clock divider signal.

Referring to FIG. 1 and FIG. 3, the reset processing module 301 may comprise circuitry which is similar to the circuitry in the reset processing module 101. However, reset processing modules 101 and 301 may be adapted to handle different types of reset input signals and to generate different types of reset output signals. For example, in one aspect of the present invention, the reset processing module 101 may utilize an active low reset input signal and generate an active low reset output 106 and an active low clock divider reset output 117. In a different aspect of the present invention, the reset processing module 301 may utilize an active high input signal received at the external reset pad 302 and generate an active high reset output 306 and an active high clock divider reset output 317. In this case, in order to accommodate the processing of the active high reset input signal, the buffers 103 and 105 in FIG. 1 may be replaced with the inverters 303 and 305 in FIG. 3, respectively, and the OR gate 116 in FIG. 1 may be replaced with the NOR gate 316 in FIG. 3.

In yet a different aspect of the present invention, the count enable inputs and the reset inputs of the counters 109 and 309 may be adapted to utilize active high and/or active low input signals. For example, the count enable input 124 of counter 109 in FIG. 1 may be adapted to accept as input the active high signal 115 from the second inverter 114. The count enable input 124 of counter 109 may also be adapted to accept as input an active low signal. In this case, the second inverter 114 may be removed and the comparator output 113 may be coupled directly to the count enable input 124 of the counter 109.

In addition, the reset input 122 of counter 109 may be adapted to accept as input the active high signal 108 from the first inverter 107. The reset input 122 of counter 109 may also be adapted to accept as input an active low signal. In this case, the first inverter 107 may be removed from the reset processing module 301 and the output from the first buffer 103 may be coupled directly to the reset input 122 of the counter 109.

Similarly, the count enable input 324 of counter 309 in FIG. 3 may be adapted to accept as input the active high signal 315 from the fourth inverter 314. The count enable input 324 of counter 309 may also be adapted to accept as input an active low signal. In this case, the fourth inverter 314 may be removed and the comparator output 313 may be coupled directly to the count enable input 324 of the counter 309.

In addition, the reset input 322 of counter 309 may be adapted to accept as input the active high signal 308 from the third inverter 307. The reset input 322 of counter 309 may also be adapted to accept as input an active low signal. In this case, the third inverter 307 may be removed from the reset processing module 301 and the output from the first inverter 303 may be coupled directly to the reset input 322 of the counter 309.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A clock divider reset circuit, comprising:
   a first inverter coupled to a counter;
   a first buffer coupled to the first inverter,
   a comparator coupled to an output of the counter;
   an OR gate coupled to an output of the comparator;
   a second buffer coupled to the OR gate and the first buffer; and
   a feedback path coupling the output of the comparator to the counter.

2. The circuit of claim 1, wherein the first inverter is coupled to a reset input of the counter.

3. The circuit of claim 2, wherein the reset input comprises an active high reset input.

4. The circuit of claim 1, wherein a clock input of the counter is coupled to an external pin clock signal.

5. The circuit of claim 1, wherein a clock input of the counter is coupled to a PLL.

6. The circuit of claim 1, wherein a first input of the comparator is coupled to a count output of the counter.

7. The circuit of claim 1, wherein a second input of the comparator is coupled to a plurality of signals associated with a full count value.

8. The circuit of claim 1, wherein the output of the second buffer is a reset signal.

9. The circuit of claim 1, wherein the output of the OR gate is a clock divider reset signal.

10. The circuit of claim 1, wherein the feedback path comprises a second inverter coupled to an output of the comparator and an input of the counter.

11. The circuit of claim 10, wherein the second inverter is coupled to a count enable input of the counter.

12. The circuit of claim 1, wherein an output of the first buffer is coupled to an input of the OR gate.

13. The circuit of claim 1, wherein the first buffer is coupled to an external reset signal.

14. The circuit of claim 13, wherein the external reset signal comprises an active low reset signal.

15. A clock divider reset circuit, comprising:
    a first inverter coupled to a counter;
    a second inverter coupled to the first inverter,
    a comparator coupled to an output of the counter;
    a NOR gate coupled to an output of the comparator;
    a third inverter coupled to the NOR gate and the second inverter; and
    a feedback path coupling the output of the comparator to the counter.

16. The circuit of claim 15, wherein the first inverter is coupled to a reset input of the counter.

17. The circuit of claim 16, wherein the reset input comprises an active high reset input.

18. The circuit of claim 15, wherein the output of the NOR gate is a clock divider reset signal.

19. The circuit of claim 15, wherein the feedback path comprises a fourth inverter coupled to an output of the comparator and an input of the counter.

20. The circuit of claim 15, wherein an output of the second inverter is coupled to an input of the NOR gate.

21. A method for resetting a chip or a circuit, comprising:
    buffering a main reset input signal;
    inverting the main reset input signal to create an active high reset signal;
    resetting a counter utilizing the active high reset signal;
    comparing a counter output value and a counter-associated value in a comparator to obtain a comparator output value; and
    applying an OR logical operation to the comparator output.

22. The method of claim 21, further comprising generating a limited duration clock divider reset from the output of the OR logical operation.

23. The method of claim 21, further comprising applying the OR logical operation to the buffered main reset input signal.

24. The method of claim 21, further comprising inverting the comparator output.

25. The method of claim 21, further comprising enabling the counter via the inverted comparator output.

26. The method of claim 21, further comprising receiving an external pin clock signal by a clock input of the counter.

27. The method of claim 21, further comprising receiving a PLL by a clock input of the counter.

28. The method of claim 21, further comprising receiving a full count value signal by an input of the comparator.

29. The method of claim 28, wherein an output of the full count value is based on a maximum count value of the counter.

* * * * *